United States Patent
Lei et al.

(10) Patent No.: US 9,299,611 B2
(45) Date of Patent: Mar. 29, 2016

(54) METHOD OF WAFER DICING USING HYBRID LASER SCRIBING AND PLASMA ETCH APPROACH WITH MASK PLASMA TREATMENT FOR IMPROVED MASK ETCH RESISTANCE

(71) Applicants: Wei-Sheng Lei, San Jose, CA (US); Brad Eaton, Menlo Park, CA (US); Ajay Kumar, Cupertino, CA (US); James S. Papanu, San Rafael, CA (US); Jungrae Park, Santa Clara, CA (US)

(72) Inventors: Wei-Sheng Lei, San Jose, CA (US); Brad Eaton, Menlo Park, CA (US); Ajay Kumar, Cupertino, CA (US); James S. Papanu, San Rafael, CA (US); Jungrae Park, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 14/167,300

(22) Filed: Jan. 29, 2014

(65) Prior Publication Data
US 2015/0214109 A1    Jul. 30, 2015

(51) Int. Cl.
| | |
|---|---|
| *H01L 31/06* | (2012.01) |
| *H01L 21/78* | (2006.01) |
| *H01L 21/308* | (2006.01) |
| *H01L 21/3065* | (2006.01) |

(Continued)

(52) U.S. Cl.
CPC .......... *H01L 21/78* (2013.01); *H01L 21/0273* (2013.01); *H01L 21/3065* (2013.01); *H01L 21/3081* (2013.01); *H01L 21/3086* (2013.01); *H01L 21/30655* (2013.01); *H01L 21/31058* (2013.01); *H01L 21/31127* (2013.01); *H01L 21/67207* (2013.01)

(58) Field of Classification Search
CPC ........ H01L 21/46; H01L 21/78; H01L 21/301; H01L 21/6836; H01L 23/544
USPC .......................................................... 438/462
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Phuc Dang
(74) *Attorney, Agent, or Firm* — Blakely Sokoloff Taylor Zafman LLP

(57) ABSTRACT

Methods of dicing semiconductor wafers, each wafer having a plurality of integrated circuits, are described. In an example, a method of dicing a semiconductor wafer having a plurality of integrated circuits involves forming a mask above the semiconductor wafer, the mask including a layer covering and protecting the integrated circuits. The mask is exposed to a plasma treatment process to increase an etch resistance of the mask. The mask is patterned with a laser scribing process to provide gaps in the mask, the gaps exposing regions of the semiconductor wafer between the integrated circuits. Subsequent to exposing the mask to the plasma treatment process, the semiconductor wafer is plasma etched through the gaps in the mask to singulate the integrated circuits.

26 Claims, 12 Drawing Sheets

(51) Int. Cl.
  *H01L 21/67*    (2006.01)
  *H01L 21/027*   (2006.01)
  *H01L 21/3105*  (2006.01)
  *H01L 21/311*   (2006.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,358,670 B1 | 3/2002 | Wong et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,750,127 B1 | 6/2004 | Chang et al. | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,557,682 B2 | 10/2013 | Holden et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2008/0032507 A1* | 2/2008 | Ventzek et al. | 438/706 |
| 2008/0073322 A1* | 3/2008 | Nozaki et al. | 216/49 |
| 2009/0255911 A1 | 10/2009 | Krishnaswami et al. | |
| 2010/0013036 A1 | 1/2010 | Carey | |
| 2010/0173474 A1* | 7/2010 | Arita et al. | 438/462 |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2012/0322238 A1* | 12/2012 | Lei et al. | 438/462 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007-281526 | 10/2007 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

International Search Report and Written Opinion from PCT/US2015/011479 mailed Apr. 30, 2015, 12 pgs.

* cited by examiner $$I = \frac{E_p}{\pi \cdot w_0^2 \cdot \tau}$$

Intensity — $I$
Pulse Energy — $E_p$
Beam Radius — $w_0$
Pulse Width — $\tau$

METHOD OF WAFER DICING USING HYBRID LASER SCRIBING AND PLASMA ETCH APPROACH WITH MASK PLASMA TREATMENT FOR IMPROVED MASK ETCH RESISTANCE

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits involves forming a mask above the semiconductor wafer, the mask including a layer covering and protecting the integrated circuits. The mask is exposed to a plasma treatment process to increase an etch resistance of the mask. The mask is patterned with a laser scribing process to provide gaps in the mask, the gaps exposing regions of the semiconductor wafer between the integrated circuits. Subsequent to exposing the mask to the plasma treatment process, the semiconductor wafer is plasma etched through the gaps in the mask to singulate the integrated circuits.

In another embodiment, a system for dicing a semiconductor wafer having a plurality of integrated circuits includes a factory interface. A laser scribe apparatus is coupled with the factory interface and houses a laser. A first plasma etch chamber is coupled with the factory interface, the first plasma etch chamber configured for performing a mask treatment operation. A second plasma etch chamber is coupled with the factory interface, the second plasma etch chamber configured for performing a deep silicon plasma etch operation.

In another embodiment, a method of dicing a semiconductor wafer having a plurality of integrated circuits involves forming a mask layer above a silicon substrate, the mask layer covering and protecting integrated circuits disposed on the silicon substrate. The integrated circuits include a layer of silicon dioxide disposed above a layer of low K material and a layer of copper. The method also involves exposing the mask layer to a plasma treatment process to increase an etch resistance of the mask layer. The method also involves patterning the mask layer, the layer of silicon dioxide, the layer of low K material, the layer of copper, and a portion of the silicon substrate with a laser scribing process to expose regions of the silicon substrate between the integrated circuits. Subsequent to exposing the mask layer to the plasma treatment process, the silicon substrate is plasma etched through the exposed regions of the silicon substrate to singulate the integrated circuits.

DETAILED DESCRIPTION

Figure 1:
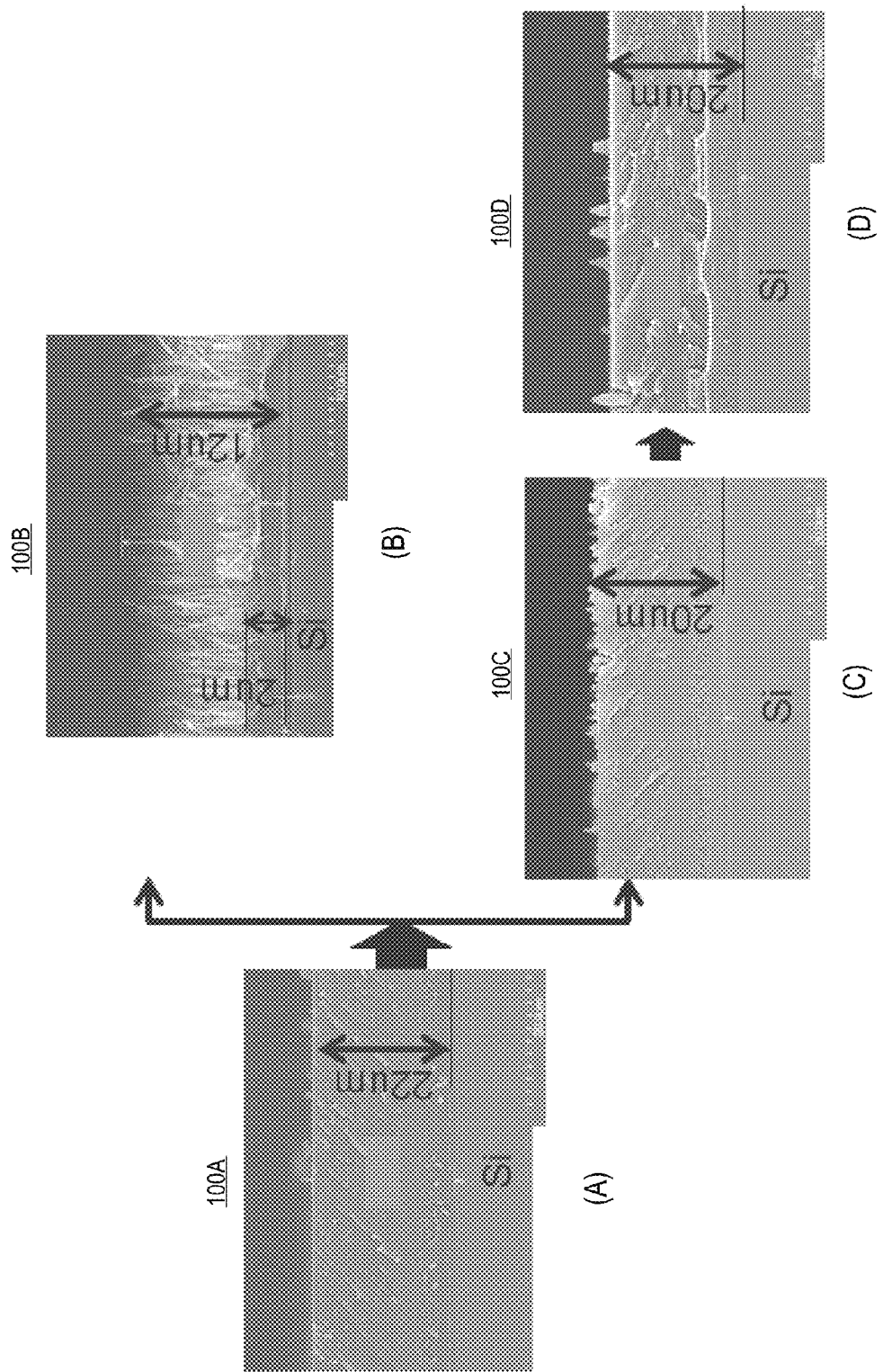
FIG. 1 includes scanning electron microscope (SEM) images of a mask/silicon substrate pairing subjected to various etch treatments, in accordance with an embodiment of the present invention.

Methods of dicing semiconductor wafers, each wafer having a plurality of integrated circuits thereon, are described. In the following description, numerous specific details are set forth, such as laser scribing, breakthrough etch, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch, with a mask plasma treatment operation, may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

More particularly, one or more embodiments are directed to implantation of mask treatment technology for improved mask etch resistance in a hybrid wafer or substrate dicing process. In one such embodiment, a mask plasma treatment operation is performed prior to the laser scribing process. In another such embodiment, a mask plasma treatment operation is performed subsequent to the laser scribing process. In either case, however, the mask plasma treatment operation is performed prior to a deep plasma etch operation used to singulate integrated circuits of the semiconductor wafer or substrate.

To provide context, considerations for mask materials for protection in etch processes can include: (1) polymer based mask materials are widely used for silicon (Si) and inorganic dielectric (wet or dry) etch processes in semiconductor and MEMS manufacturing, such as plasma through silicon via (TSV) formation and wafer dicing; (2) mask material to Si etch selectivity, which is the ratio of mask etch rate to Si etch rate under same processing conditions, is a key parameter in mask material selection; (3) depending on specific applications, different mask formation technologies have been developed, including spin coating, spray coating, screen printing, dry film vacuum lamination, plasma deposition, etc.

In general, a thin mask may be preferred so long as long the mask can provide sufficient protection during an etch process. The thin mask may have advantages such as, but not limited to, for many reasons: (a) saving material cost; (b) a thinner mask typically provides improved resolution for etched pattern definition; and (c) a thinner mask tends to have fewer associated defects, such as voids or bubbles. A required mask thickness can be determined by mask-to-Si (or $SiO_2$ or metal) etch selectivity, or fundamentally by the mask material etch rate. However, little effort has been focused on improving mask material resistance to etch (or reducing relative mask material etch rates). For example, typical photoresist (PR) to Si etch selectivity is about 1:30 (e.g., 1 micron of mask material may be consumed for etching every 30 microns of Si). With the above considered, for high aspect ratio etching such as TSV and plasma wafer dicing in semiconductor applications or deep trench etch in MEMS applications, due to limited mask-to-Si etch selectivity, thick mask layers are often needed. However, formation of defect/bubble (void)—free thick masks can be challenging. For example, when a mask layer contains voids, its nominal thickness becomes meaningless, since at the site of void, the effective (net) mask thickness can be much less than the nominal thickness, so the overall etch resistance of mask layer is determined by the effective mask thickness, not by the nominal thickness.

More specifically, typical photoresist (PR) mask layer thicknesses used are 1.5 microns, 3 microns, and 5 microns. For 10 micron thick PR masks, severe defects are often readily involved. Aside from increasing mask thickness, however, another option is to select a mask material that has a high etch resistance (i.e., lower etch rate). However, such materials are not necessarily available. Additionally, specific types of mask materials are often preferred for certain processes, and there is often little freedom to improve mask etch rate by changing the type of mask material. For example, in plasma dicing applications, a water soluble mask material may be preferred for easy removal of remaining mask post dicing. In accordance with an embodiment of the present invention, approaches described herein can be used to improve etch resistance (or to lower an associated etch rate) of a known mask material, such as a water-soluble mask material, formed by a process including, but not limited to, spin coating, spray coating, screen printing, dry film vacuum lamination, or plasma deposition.

In accordance with one or more embodiments of the present invention, a mask pre-treatment technology is described that can be implemented improve the etch resistance of a given mask material, such as a water-soluble mask material, in a deep silicon etch process. In one such embodiment, upon formation of a mask material layer on a wafer, e.g., by spin coating, spray coating, screen printing, dry film vacuum lamination, or plasma deposition, the wafer is loaded into a plasma chamber with the mask side facing the plasma source. Using inertial gas(es) such as argon (Ar) gas or other gases that are not chemically reactive to the mask material, such as nitrogen ($N_2$) gas, under strong bias power, a Ar or non-reactive gas plasma is used to effect strong physical bombardment to "hammer" the exposed mask surface, and thus realize improvement of mask etch resistance. The improvement of mask etch resistance under physical bombardment may be due to different mechanisms depending on specific mask materials. For example, in one embodiment, the physical bombardment under certain high temperature may cause cross-linking of molecules at the mask surface. Additionally or alternatively, the bombardment can be used to modify the surface profile of a mask material. Another possible mechanism involves the use of physical bombardment to effect the removal of remaining solvent from the mask material, thus leading to mask condensation. Regardless of the specific mechanism(s) involved, in an embodiment, using Ar or other non-reactive gas based plasma treatment, the etch resistance of a mask material can be significantly improved for the case of PR mask or water soluble masks formed by spin coating, or Teflon masks formed by plasma deposition. Embodiments can be equally applicable to mask materials formed by spray coating, screen printing, dry film lamination, etc.

Figure 2:
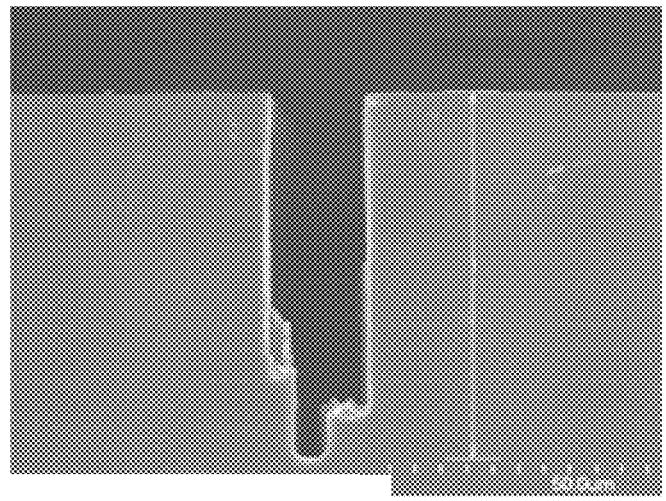
FIG. 2 is an SEM image following mask removal from the mask/silicon substrate pairing (D) of FIG. 1, in accordance with an embodiment of the present invention.

As an example of one or more of the issues involved, FIG. 1 includes scanning electron microscope (SEM) images of a mask/silicon substrate pairing subjected to various etch treatments, in accordance with an embodiment of the present invention. Referring to FIG. 1, part (A) is an SEM image 100A of a silicon wafer (Si) as coated with approximately 22 microns of a water-soluble mask material layer. Part (B) of FIG. 1 is an SEM image 100B following a deep silicon plasma etch process as applied to the water soluble mask layer. The water-soluble mask layer yields a "hairy: mask having an effective mask thickness reduced to approximately 2 microns following exposure to the plasma etch process. By contrast, part (C) of FIG. 1 is an SEM image 100C following a mask plasma treatment operation employed to improve the etch resistance of the mask layer. As can be seen in image 100C, the effective mask thickness is reduced by at most 2 microns during the plasma treatment, and is reduced in a uniform manner. Part (D) of FIG. 1 is an SEM image 100D following a deep silicon plasma etch process as applied to the plasma-treated water soluble mask layer. The plasma-treated water soluble mask layer maintain an effective mask thickness at the same approximately 20 microns reaming following the plasma mask etch resistance improvement treatment. Furthermore, FIG. 2 is an SEM image following mask removal from the mask/silicon substrate pairing (D) of FIG. 1, in accordance with an embodiment of the present invention. Referring to SEM image 200, following the deep Si trench etch, the plasma treated water soluble mask is removed by an aqueous treatment process. That is, the plasma treated water soluble mask remains water soluble following the plasma mask treatment and subsequent deep silicon etch processes.

More generally, one or more embodiments are directed to mask treatment technology for improved etching resistance for a variety of mask material types. For example, in another embodiment, such treatment has proven effective for increasing etch resistance of photoresist mask layers and Teflon-like plasma-deposited ($CF_2$) films, in addition to water-soluble layers. In a specific embodiment, etch selectivity for a Teflon-like plasma-deposited ($CF_2$) film formed from $C_4F_8$ plasma deposition (where approximately 2 minutes of deposition time achieved approximately 3-4 microns of mask material) has an as-deposited film-to-Si etch selectivity of approximately 1:17. Upon implementation of a plasma pre-treatment post mask deposition, but prior to deep silicon etching, the plasma treated film-to-Si etch selectivity is approximately 1:33.

To provide broader context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 3:
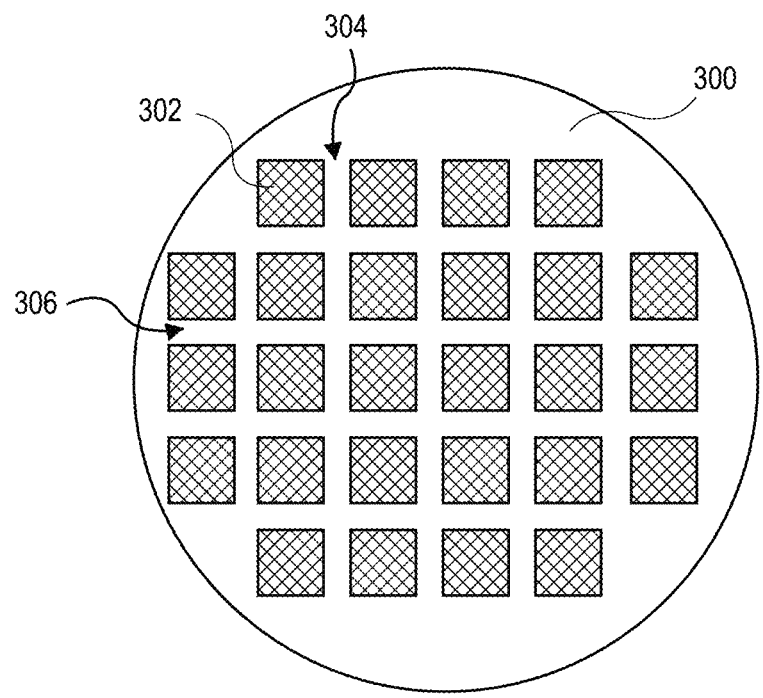
FIG. 3 illustrates a top plan of a semiconductor wafer to be diced, in accordance with an embodiment of the present invention.
Figure 4:
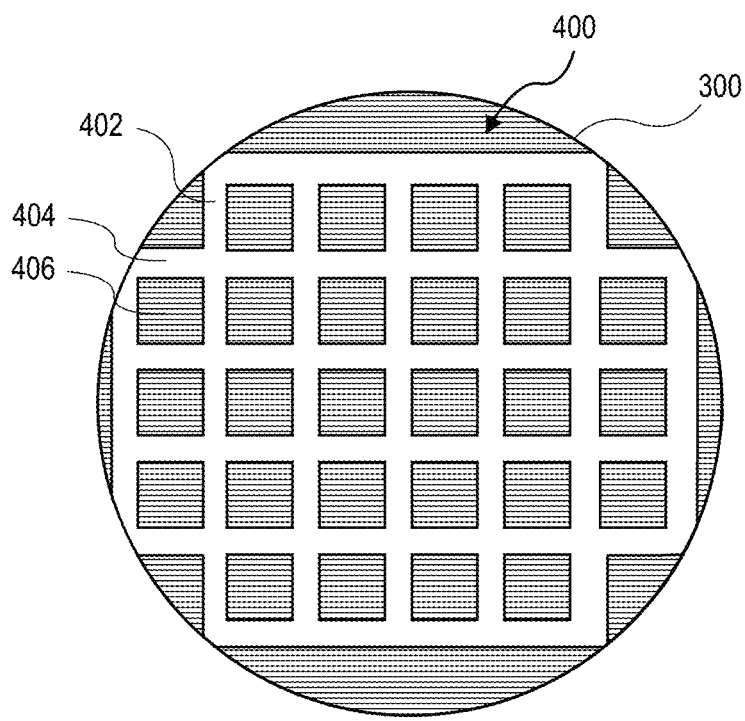
FIG. 4 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 3 illustrates a top plan of a semiconductor wafer to be diced, in accordance with an embodiment of the present invention. FIG. 4 illustrates a top plan of a semiconductor wafer to be diced that has a dicing mask formed thereon, in accordance with an embodiment of the present invention.

Referring to FIG. 3, a semiconductor wafer 300 has a plurality of regions 302 that include integrated circuits. The regions 302 are separated by vertical streets 304 and horizontal streets 306. The streets 304 and 306 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 4, the semiconductor wafer 300 has a mask 400 deposited upon the semiconductor wafer 300. The mask 400 and, possibly, a portion of the semiconductor wafer 300 are patterned with a laser scribing process to define the locations (e.g., gaps 402 and 404) along the streets 304 and 306 where the semiconductor wafer 300 will be diced. The integrated circuit regions of the semiconductor wafer 300 are covered and protected by the mask 400. The regions 406 of the mask 400 are positioned such that during a subsequent etching process, the integrated circuits are not degraded by the etch process. Accordingly, horizontal gaps 404 and vertical gaps 402 are formed between the regions 406 to define the areas that will be etched during the etching process to finally dice the semiconductor wafer 300. In accordance with embodiments described herein, a mask plasma treatment operation is performed either prior to or subsequent to the laser scribing, but prior to the plasma etching used to singulate the individual integrated circuits 302. The mask plasma treatment operation may be used to render the mask 400 more etch resistant during the subsequent plasma etching.

Figure 5:
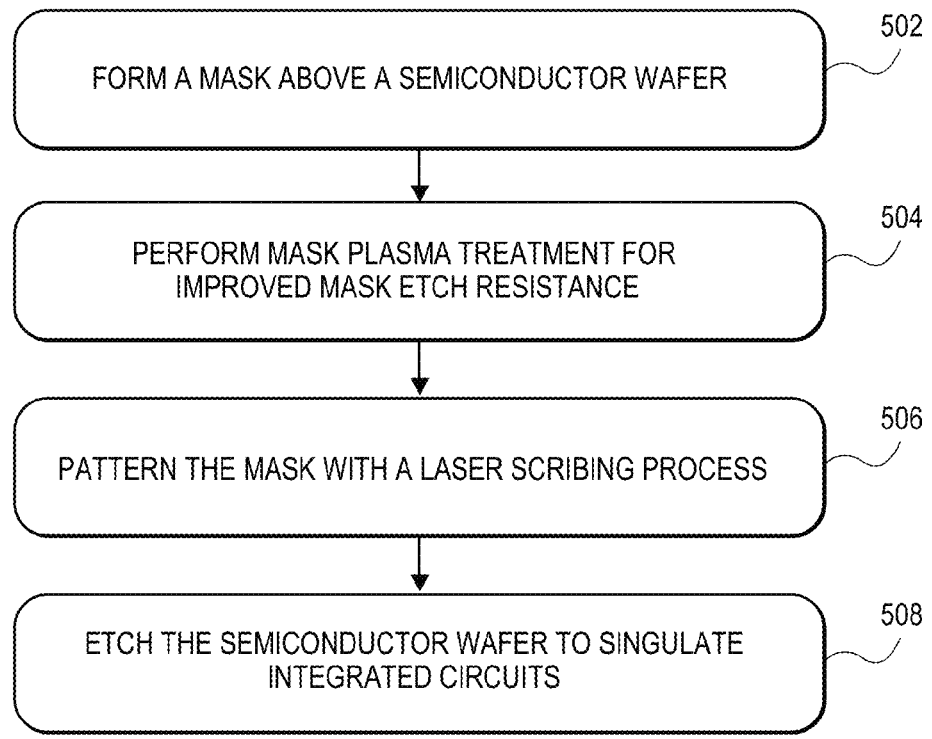
FIG. 5 is a Flowchart representing operations in a method of dicing a semiconductor wafer including a plurality of integrated circuits, in accordance with an embodiment of the present invention.
Figure 6A:
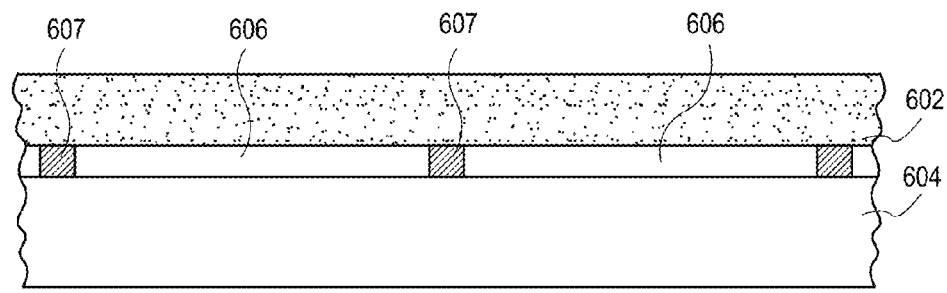
FIG. 6A illustrates a cross-sectional view of a semiconductor wafer including a plurality of integrated circuits during performing of a method of dicing the semiconductor wafer, corresponding to operation 502 of the Flowchart of FIG. 5, in accordance with an embodiment of the present invention.
Figure 6B:
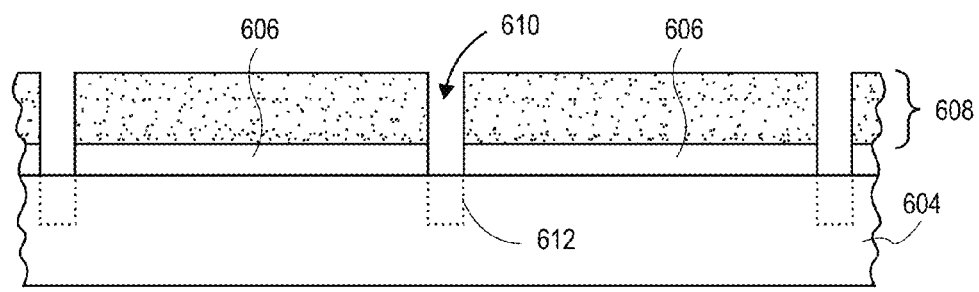
FIG. 6B illustrates a cross-sectional view of a semiconductor wafer including a plurality of integrated circuits during performing of a method of dicing the semiconductor wafer, corresponding to operation 506 of the Flowchart of FIG. 5, in accordance with an embodiment of the present invention.
Figure 6C:
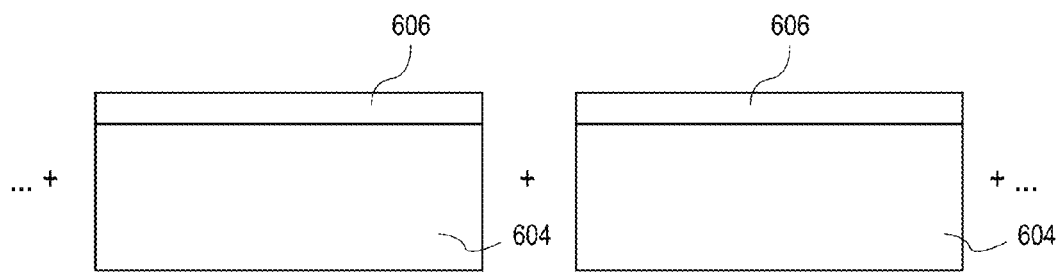
FIG. 6C illustrates a cross-sectional view of a semiconductor wafer including a plurality of integrated circuits during performing of a method of dicing the semiconductor wafer, corresponding to operation 508 of the Flowchart of FIG. 5, in accordance with an embodiment of the present invention.

FIG. 5 is a Flowchart 500 representing operations in a method of dicing a semiconductor wafer including a plurality of integrated circuits, in accordance with an embodiment of the present invention. FIGS. 6A-6C illustrate cross-sectional views of a semiconductor wafer including a plurality of integrated circuits during performing of a method of dicing the semiconductor wafer, corresponding to operations of Flowchart 500, in accordance with an embodiment of the present invention.

Referring to operation 502 of Flowchart 500, and corresponding FIG. 6A, a mask 602 is formed above a semiconductor wafer or substrate 604. The mask 602 is composed of a layer covering and protecting integrated circuits 606 formed on the surface of semiconductor wafer 604. The mask 602 also covers intervening streets 607 formed between each of the integrated circuits 606.

In accordance with an embodiment of the present invention, forming the mask 602 involves forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 602 involves forming a layer deposited in a plasma deposition process. For example, in one such embodiment, the mask 602 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 602 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 602 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a material such as, e.g., a material substrate used in the fabrication of light emitting diodes (LEDs).

In an embodiment, semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

Referring to operation 504 of Flowchart 500, a mask plasma treatment is performed for improving mask etch resistance. In one such embodiment, the plasma treatment process is performed prior to patterning the mask 602 with a laser scribing process such as described below in association with FIG. 6B. That is, the plasma treatment process is performed between the processes depicted in FIGS. 6A and 6B, and in the order shown in flowchart 500. In another such embodiment, however, the plasma treatment process is performed subsequent to patterning the mask 602 with a laser scribing process such as described below in association with FIG. 6B. That is, the plasma treatment process is performed between the processes depicted in FIGS. 6B and 6C, with a reverse order of operations 504 and 506 to that shown in flowchart 500. In either case, however, the mask plasma treatment is performed prior to performing the substrate plasma etch for die singulation such as described in association with FIG. 6C.

In an embodiment, the mask 602 is formed by spin-coating a layer of photoresist or a water soluble mask layer on the integrated circuits. In that embodiment, exposing the mask 602 to the plasma treatment process of operation 504 involves removing residual deposition solvent remaining from forming the mask 602 via the spin-coating process. In another embodiment, the mask 602 is formed by plasma-depositing a Teflon or Teflon-like ($CF_2$) mask material on the integrated circuits. In that embodiment, exposing the mask 602 to the plasma treatment process of operation 504 involves condensing the Teflon mask layer 602, e.g., by densifying the material.

In an embodiment, the mask plasma treatment of operation 504 involves exposing the mask 602 to a plasma based on argon (Ar) gas, nitrogen ($N_2$) gas, or a combination of Ar and $N_2$ gas. In one such embodiment, the plasma source power is approximately in the range of 2000 W to 4500 W, the bias power is approximately in the range of 1000 W to 2000 W, and gas pressure is approximately in the range of 100 mTorr to 250 mTorr. Process time is approximately in the range of 30 seconds to 90 seconds. In an embodiment, so long as the source/bias power is not high enough as to cause plasma etching removal of the mask due to over-strong bombardment, higher source and bias power is preferred since shorter process times may be used to achieve a mask "hardening" effect.

Referring to operation 506 of Flowchart 500, and corresponding FIG. 6B, the mask 602 is patterned with a laser scribing process to provide a patterned mask 608 with gaps 610, exposing regions of the semiconductor wafer or substrate 604 between the integrated circuits 606. As such, the laser scribing process is used to remove the material of the streets 607 originally formed between the integrated circuits 606. In accordance with an embodiment of the present invention, patterning the mask 602 with the laser scribing process includes forming trenches 612 partially into the regions of the semiconductor wafer 604 between the integrated circuits 606, as depicted in FIG. 6B.

In an embodiment, patterning the mask 606 with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 602, the streets 607 and, possibly, a portion of the semiconductor wafer or substrate 604.

Figure 7:
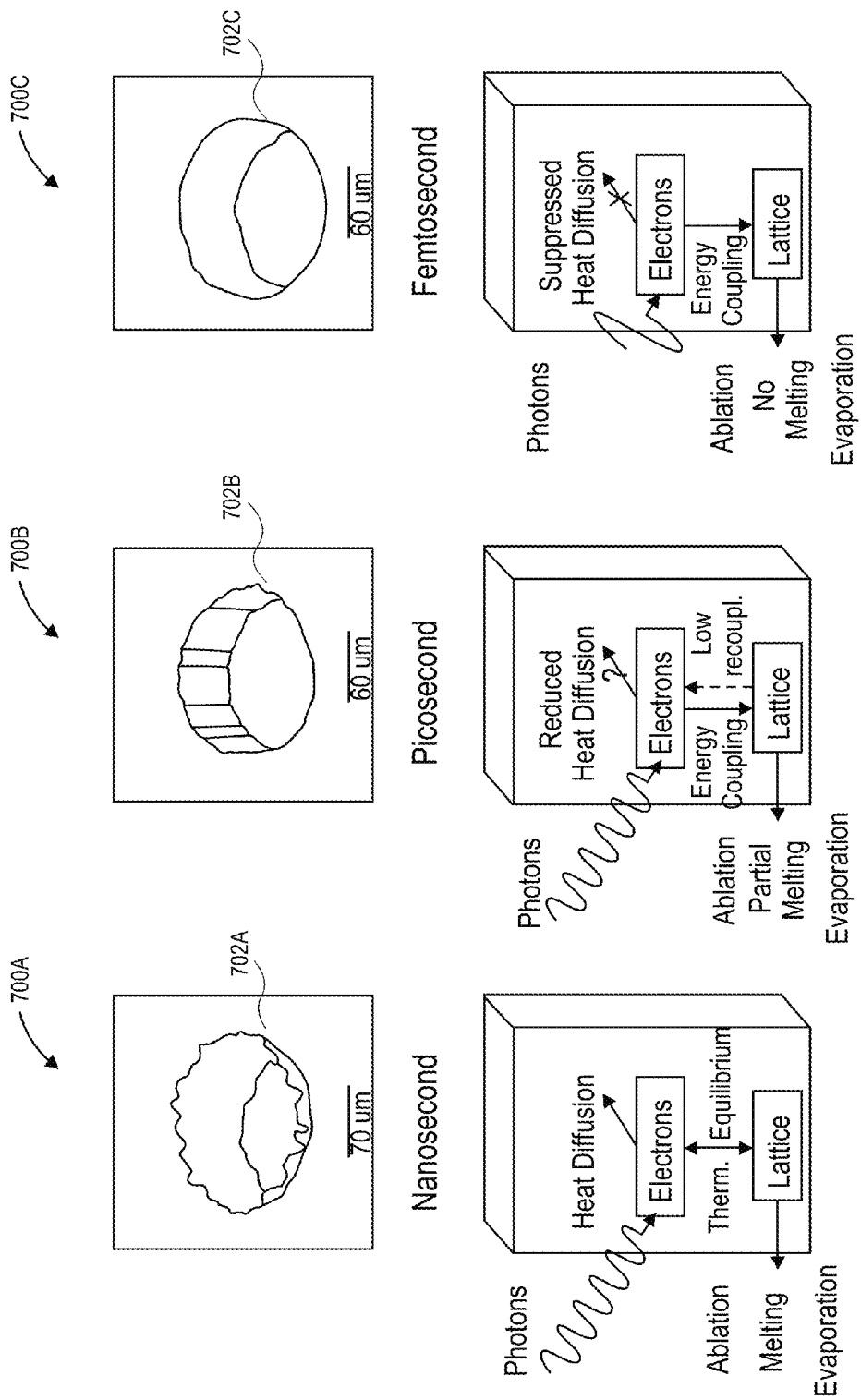
FIG. 7 illustrates the effects of using a laser pulse in the femtosecond range versus longer pulse times, in accordance with an embodiment of the present invention.

FIG. 7 illustrates the effects of using a laser pulse in the femtosecond range versus longer frequencies, in accordance with an embodiment of the present invention. Referring to FIG. 7, by using a laser with a pulse width in the femtosecond range heat damage issues are mitigated or eliminated (e.g., minimal to no damage 702C with femtosecond processing of a via 700C) versus longer pulse widths (e.g., damage 702B with picosecond processing of a via 700B and significant damage 702A with nanosecond processing of a via 700A). The elimination or mitigation of damage during formation of via 700C may be due to a lack of low energy recoupling (as is seen for picosecond-based laser ablation) or thermal equilibrium (as is seen for nanosecond-based laser ablation), as depicted in FIG. 7.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 8 illustrates a cross-sectional view of a stack of materials that may be used in a street region of a semiconductor wafer or substrate, in accordance with an embodiment of the present invention.

Figure 8:
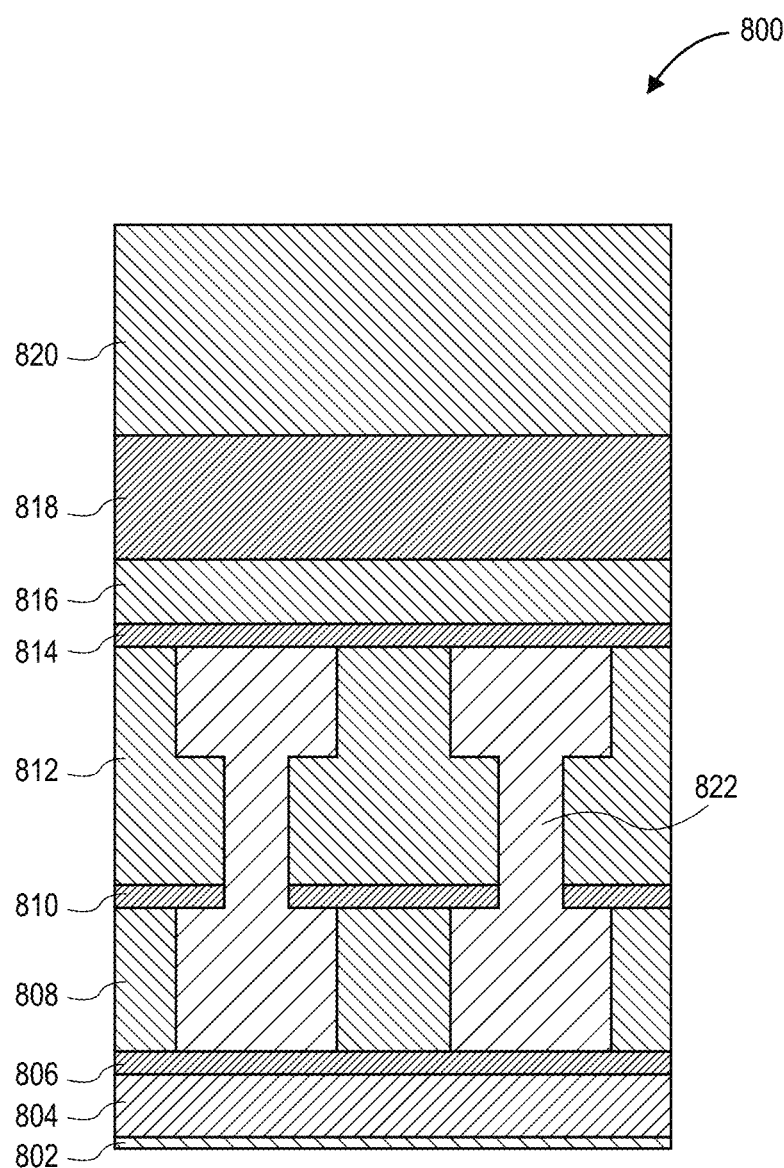
FIG. 8 illustrates a cross-sectional view of a stack of materials that may be used in a street region of a semiconductor wafer or substrate, in accordance with an embodiment of the present invention.

Referring to FIG. 8, a street region 800 includes the top portion 802 of a silicon substrate, a first silicon dioxide layer 804, a first etch stop layer 806, a first low K dielectric layer 808 (e.g., having a dielectric constant of less than the dielectric constant of 4.0 for silicon dioxide), a second etch stop layer 810, a second low K dielectric layer 812, a third etch stop layer 814, an undoped silica glass (USG) layer 816, a second silicon dioxide layer 818, and a mask layer 820, with possible relative thicknesses depicted. Copper metallization 822 is disposed between the first and third etch stop layers 806 and 814 and through the second etch stop layer 810. In a specific embodiment, the first, second and third etch stop layers 806, 810 and 814 are composed of silicon nitride, while low K dielectric layers 808 and 812 are composed of a carbon-doped silicon oxide material.

Figures 9, 10:
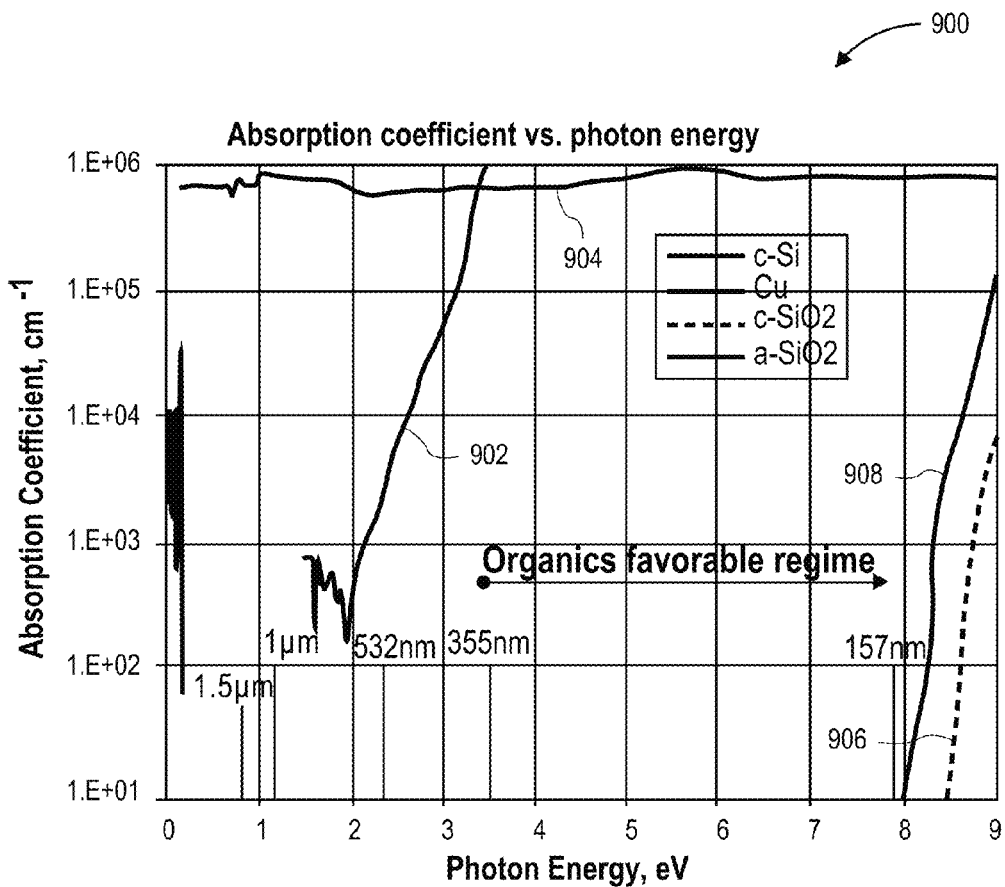
FIG. 9 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 10 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 800 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 9 includes a plot 900 of absorption coefficient as a function of photon energy for crystalline silicon (c-Si, 902), copper (Cu, 904), crystalline silicon dioxide (c-$SiO_2$, 906), and amorphous silicon dioxide (a-$SiO_2$, 908), in accordance with an embodiment of the present invention. FIG. 10 is an equation 1000 showing the relationship of laser intensity for a given laser as a function of laser pulse energy, laser pulse width, and laser beam radius.

Using equation 1000 and the plot 900 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in a stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIG. 6B, an intermediate post mask-opening cleaning operation may optionally performed following the laser scribing but prior to the plasma etching described below in association with FIG. 6C. In an embodiment, the post mask-opening cleaning operation is a plasma-based cleaning process. In a first example, as described below, the plasma-based cleaning process is reactive to the regions of the substrate 604 exposed by the gaps 610. In the case of a reactive plasma-based cleaning process, the cleaning process itself may form or extend trenches 612 in the substrate 604 since the reactive plasma-based cleaning operation is at least somewhat of an etchant for the substrate 604. In a second, different, example, as is also described below, the plasma-based cleaning process is non-reactive to the regions of the substrate 604 exposed by the gaps 610.

In accordance with a first embodiment, the plasma-based cleaning process is reactive to exposed regions of the substrate 604 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist or plasma-deposited Teflon masks 602, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the substrate 604 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks or for thinner plasma-deposited Teflon 602. In an exemplary embodiment of the latter case, an $SF_6+Ar$ breakthrough cleaning process exhibits an etch rate of approximately 7.66 microns/minute for as-deposited plasma-based Teflon. By contrast, an Ar-only breakthrough cleaning process exhibits an etch rate of approximately 0.85 microns/minute. In another such embodiment, separate mask condensation and scribed trench cleaning operations are used, e.g., an Ar or non-reactive gas (or the mix) highly-biased plasma treatment for mask condensation is first performed, and the an $Ar+SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) $Ar+SF_6$ highly-biased plasma cleaning of laser scribed trenches, and (c) Ar or non-reactive gas (or the mix) highly-biased plasma treatment for mask condensation.

Referring to operation 508 of Flowchart 500, and corresponding FIG. 6C, the semiconductor wafer 604 is etched through the gaps 610 in the patterned mask 608 to singulate the integrated circuits 606. In accordance with an embodiment of the present invention, etching the semiconductor wafer 604 includes etching the trenches 612 formed with the laser scribing process (and possibly extended with a reactive post-mask-opening clean operation) to ultimately etch entirely through semiconductor wafer 604, as depicted in FIG. 6C.

In an embodiment, etching the semiconductor wafer 604 includes using a plasma etching process. In one embodiment, a through-silicon via type etch process is used. For example, in a specific embodiment, the etch rate of the material of semiconductor wafer 604 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, generally a fluorine-based gas such as $SF_6$, $C_4F_8$, $CHF_3$, $XeF_2$, or any other reactant gas capable of etching silicon at a relatively fast etch rate. In an embodiment, the mask layer 608 is removed after the singulation process, as depicted in FIG. 6C.

In another embodiment, the plasma etching operation described in association with FIG. 6C employs a conventional Bosch-type dep/etch/dep process to etch through the substrate 604. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which may be rough. This is particularly the effect where the laser scribing process generates an open trench much rougher than that which a lithographically defined etch process achieves. Such a rough die edge leads to lower than expected die break strength. In addition, the deposition sub-step in a Bosch process generates a Flourine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (~0.15 um/min) so the smoothening treatment is more controllable. The high bias power is applied to achieve relatively high directional etch rates to etch off the ridges or rims on the sidewall.

Accordingly, referring again to Flowchart 500 and FIGS. 6A-6C, wafer dicing may be preformed by initial laser ablation through a mask layer, through wafer streets (including metallization), and partially into a silicon substrate. The laser pulse width may be selected in the femtosecond range. Die singulation may then be completed by subsequent through-silicon deep plasma etching. A plasma treatment may be performed on the mask layer prior to or subsequent to the laser ablation, but prior to the through-silicon deep plasma etching. A specific example of a materials stack for dicing is described below in association with FIGS. 11A-11D, in accordance with an embodiment of the present invention.

Figure 11A:
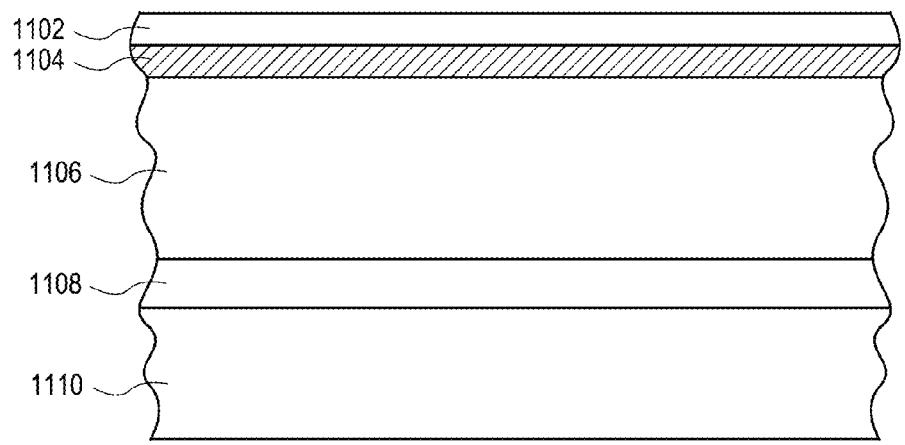
FIGS. 11A-11D illustrate cross-sectional views of various operations in a method of dicing a semiconductor wafer, in accordance with an embodiment of the present invention.

Referring to FIG. 11A, a materials stack for hybrid laser ablation and plasma etch dicing includes a mask layer 1102, a device layer 1104, and a substrate 1106. The mask layer, device layer, and substrate are disposed above a die attach film 1108 which is affixed to a backing tape 1110. In an embodiment, the mask layer 1102 is a photo-resist layer, a plasma-deposited Teflon layer, or a water-soluble layer, such as described above in association with mask 602. The device layer 1104 includes an inorganic dielectric layer (such as silicon dioxide) disposed above one or more metal layers (such as copper layers) and one or more low K dielectric layers (such as carbon-doped oxide layers). The device layer 1104 also includes streets arranged between integrated circuits, the streets including the same or similar layers to the integrated circuits. The substrate 1106 is a bulk single-crystalline silicon substrate.

In an embodiment, the bulk single-crystalline silicon substrate 1106 is thinned from the backside prior to being affixed to the die attach film 1108. The thinning may be performed by a backside grind process. In one embodiment, the bulk single-crystalline silicon substrate 1106 is thinned to a thickness approximately in the range of 50-100 microns. It is important to note that, in an embodiment, the thinning is performed prior to a laser ablation, plasma cleaning, and plasma etch dicing process. In an embodiment, the mask layer 1102 has a thickness of approximately 20 microns and the device layer 1104 has a thickness approximately in the range of 2-3 microns. In an embodiment, the die attach film 1108 (or any suitable substitute capable of bonding a thinned or thin wafer or substrate to the backing tape 1110) has a thickness of approximately 20 microns.

In accordance with an embodiment of the present invention, a mask plasma treatment is performed for improving mask layer 1102 etch resistance, examples of which are described in association with operation 504 of Flowchart 500. In one such embodiment, the plasma treatment process is performed prior to patterning the mask layer 1102 with a laser scribing process 1112 such as described below in association with FIG. 11B. That is, the plasma treatment process is performed between the processes depicted in FIGS. 11A and 11B. In another such embodiment, however, the plasma treatment process is performed subsequent to patterning the mask layer 1102 with a laser scribing process 1112. That is, the plasma treatment process is performed between the processes depicted in FIGS. 11B and 11C. In either case, however, the mask layer 1102 plasma treatment is performed prior to performing the silicon substrate plasma etch for die singulation such as described in association with FIG. 11C.

Figure 11B:
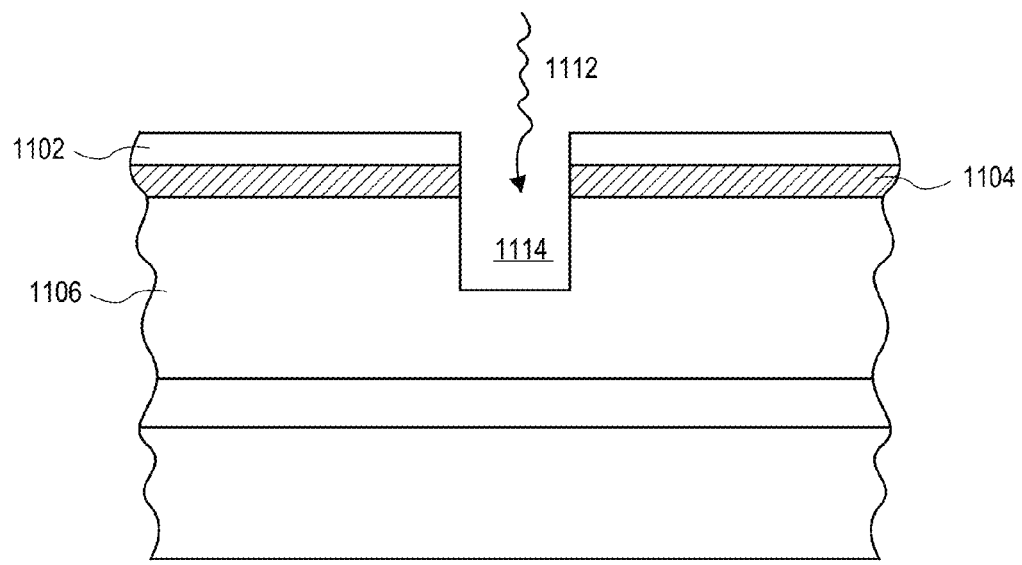
Figure 11C:
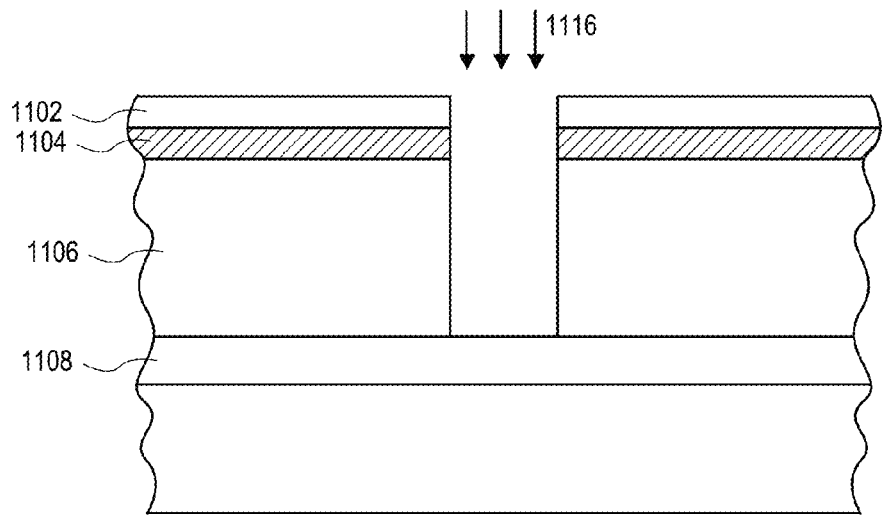

Referring to FIG. 11B, the mask 1102, the device layer 1104 and a portion of the substrate 1106 are patterned with a laser scribing process, such as a femtosecond-based laser scribing process, 1112, to form trenches 1114 in the substrate 1106. Referring to FIG. 11C, a through-silicon deep plasma etch process 1116 is used to extend the trench 1114 down to the die attach film 1108, exposing the top portion of the die attach film 1108 and singulating the silicon substrate 1106. In an embodiment, the device layer 1104 is protected by the plasma-treated mask layer 1102 during the through-silicon deep plasma etch process 1116.

Figure 11D:
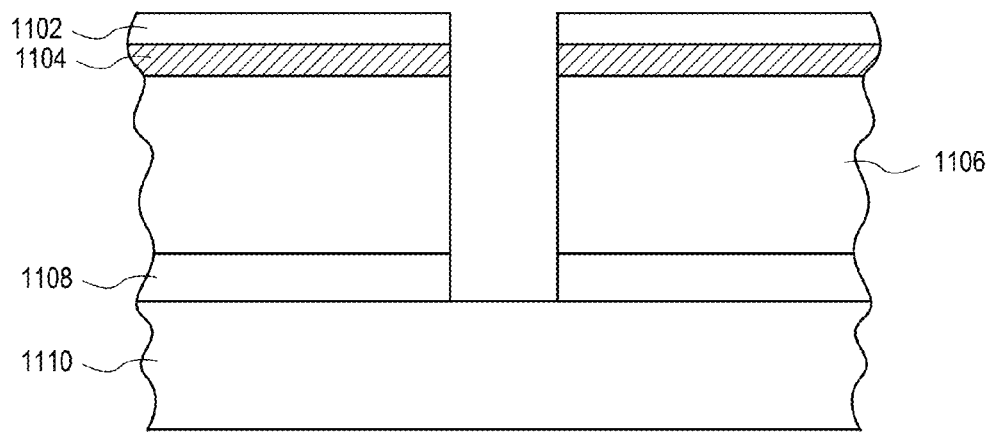

Referring to FIG. 11D, the singulation process may further include patterning the die attach film 1108, exposing the top portion of the backing tape 1110 and singulating the die attach film 1108. In an embodiment, the die attach film is singulated by a laser process or by an etch process. Further embodiments may include subsequently removing the singulated portions of substrate 1106 (e.g., as individual integrated circuits) from the backing tape 1110. In one embodiment, the singulated die attach film 1108 is retained on the back sides of the singulated portions of substrate 1106. Other embodiments may include removing the masking layer 1102 from the device layer 1104. In an embodiment, the singulated integrated circuits are removed from the backing tape 1110 for packaging. In one such embodiment, the patterned die attach film 1108 is retained on the backside of each integrated circuit and included in the final packaging. However, in another embodiment, the patterned die attach film 1108 is removed during or subsequent to the singulation process.

A single process tool may be configured to perform many or all of the operations in a hybrid laser ablation, mask treatment, and plasma etch singulation process. For example, FIG. 12 illustrates a block diagram of a tool layout for laser and plasma dicing of wafers or substrates, in accordance with an embodiment of the present invention.

Figure 12:
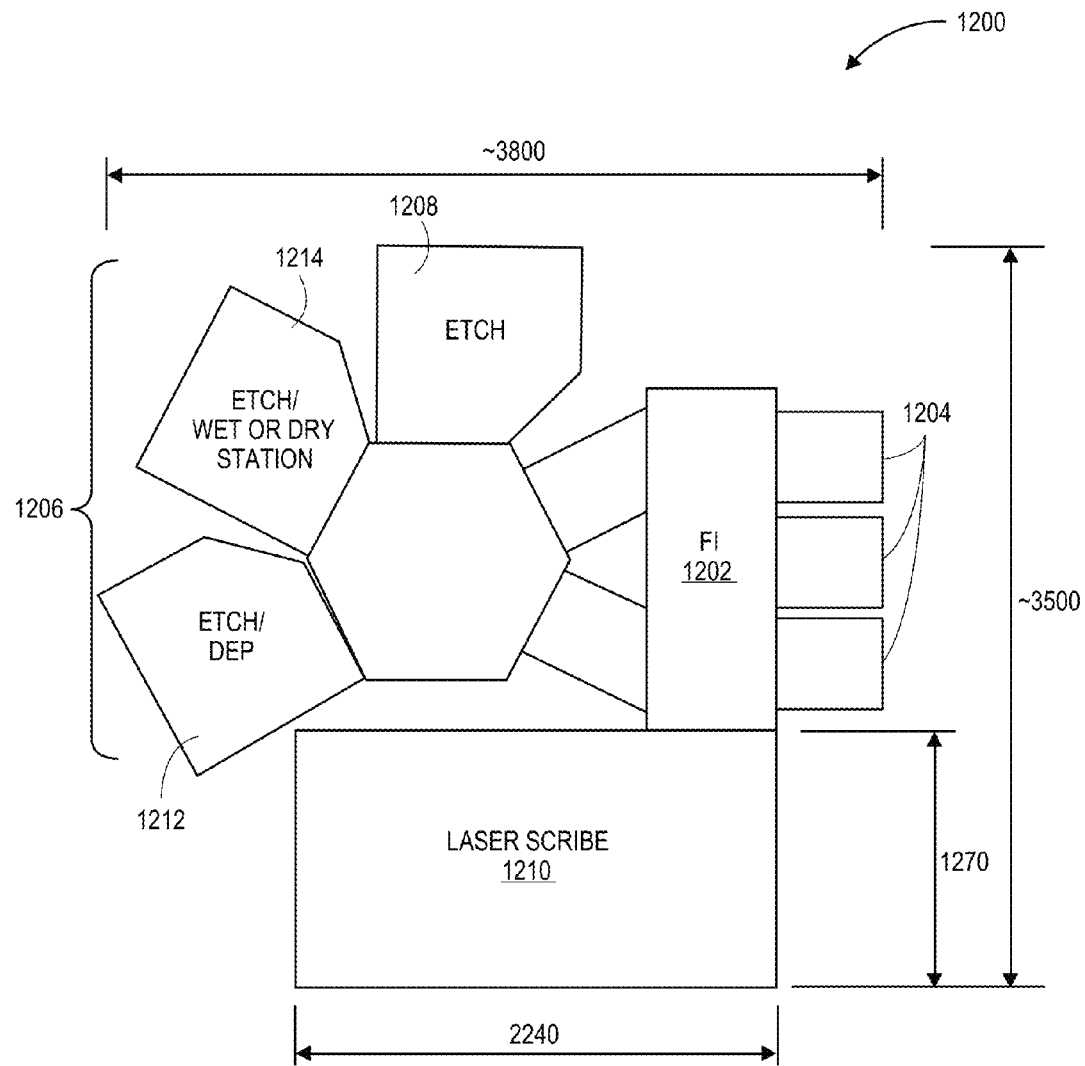
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process. In another embodiment, however, a dedicated plasma etch chamber is configured for performing a mask treatment operation.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a deposition chamber 1212 is included. The deposition chamber 1212 may be configured for mask deposition on or above a device layer of a wafer or substrate prior to laser scribing of the wafer or substrate. In one such embodiment, a separate etch chamber is included for performing a mask treatment operation, and the deposition chamber 1212 is suitable for depositing a layer of photoresist (PR), a layer of water-soluble material, or a layer of plasma-deposited Teflon. In another embodiment, in place of an additional etch chamber, a wet/dry station 1214 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
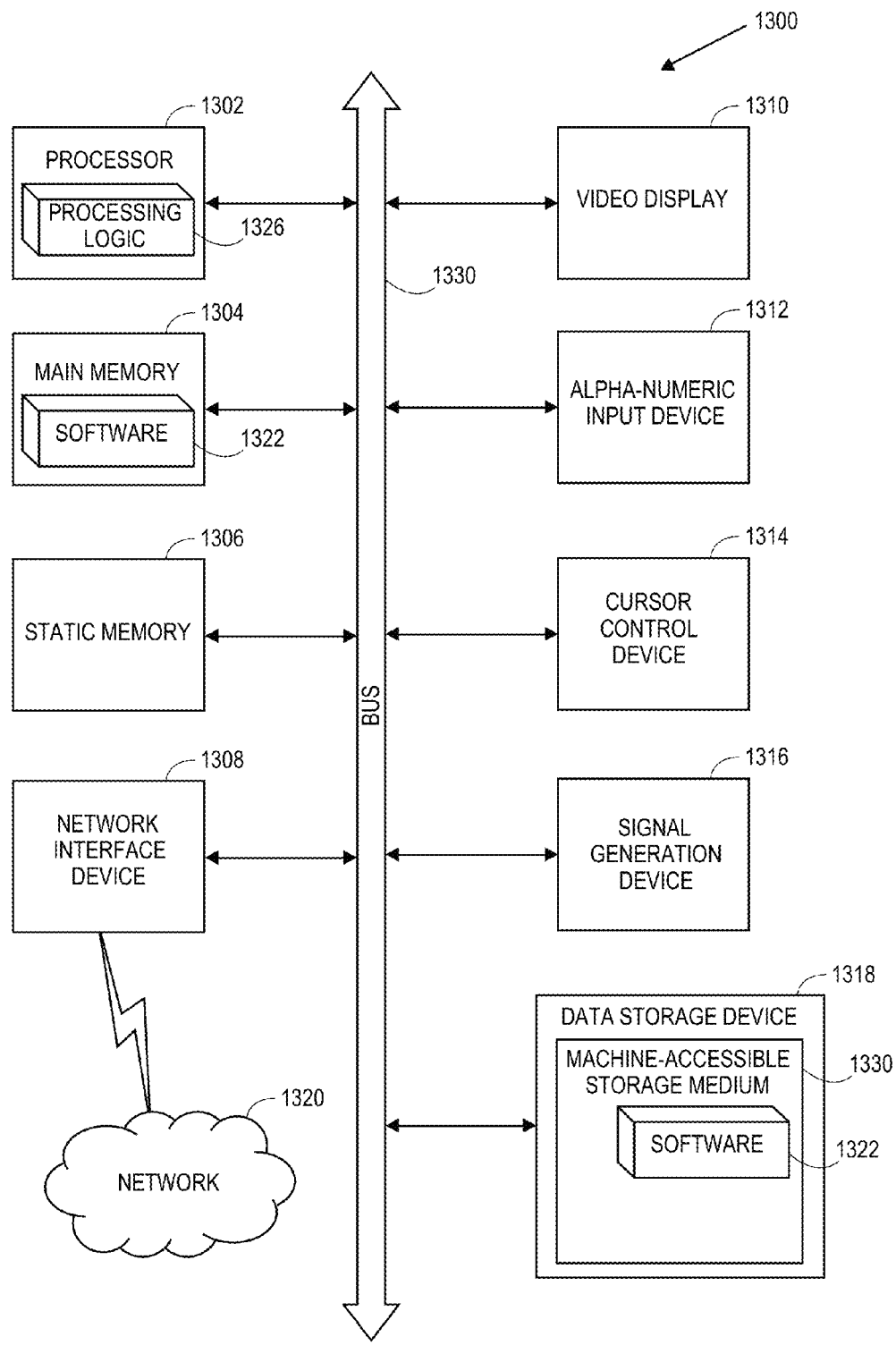
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves forming a mask above the semiconductor wafer, the mask including a layer covering and protecting the integrated circuits. The mask is exposed to a plasma treatment process to increase an etch resistance of the mask. The mask is patterned with a laser scribing process to provide gaps in the mask, the gaps exposing regions of the semiconductor wafer between the integrated circuits. Subsequent to exposing the mask to the plasma treatment process, the semiconductor wafer is plasma etched through the gaps in the mask to singulate the integrated circuits. Thus, methods of dicing semiconductor wafers, each wafer having a plurality of integrated circuits, have been disclosed.

What is claimed is:

1. A method of dicing a semiconductor wafer comprising a plurality of integrated circuits, the method comprising:
   forming a mask above the semiconductor wafer, the mask comprising a layer covering and protecting the integrated circuits;
   exposing the mask to a plasma treatment process to increase an etch resistance of the mask;
   patterning the mask with a laser scribing process to provide gaps in the mask, the gaps exposing regions of the semiconductor wafer between the integrated circuits, wherein the exposing the mask to the plasma treatment process is performed prior to patterning the mask with the laser scribing process; and
   subsequent to exposing the mask to the plasma treatment process, plasma etching the semiconductor wafer through the gaps in the mask to singulate the integrated circuits.

2. The method of claim 1, wherein forming the mask comprises spin-coating a layer of photoresist or a water soluble mask layer on the integrated circuits, and wherein exposing the mask to the plasma treatment process comprises removing residual deposition solvent remaining from forming the mask.

3. The method of claim 1, wherein forming the mask comprises plasma-depositing a Teflon mask layer on the integrated circuits, and wherein exposing the mask to the plasma treatment process comprises condensing the Teflon mask layer.

4. The method of claim 1, wherein exposing the mask to the plasma treatment process comprises using a plasma based on argon (Ar) gas, nitrogen ($N_2$) gas, or a combination of Ar and $N_2$ gas.

5. The method of claim 1, wherein patterning the mask with the laser scribing process comprises forming trenches in the regions of the semiconductor wafer between the integrated circuits, and wherein plasma etching the semiconductor wafer comprises extending the trenches to form corresponding trench extensions.

6. The method of claim 5, wherein each of the trenches has a width, and wherein each of the corresponding trench extensions has the width.

7. A method of dicing a semiconductor wafer comprising a plurality of integrated circuits, the method comprising:
forming a mask layer above a silicon substrate, the mask layer covering and protecting integrated circuits disposed on the silicon substrate, the integrated circuits comprising a layer of silicon dioxide disposed above a layer of low K material and a layer of copper;
exposing the mask layer to a plasma treatment process to increase an etch resistance of the mask layer;
patterning the mask layer, the layer of silicon dioxide, the layer of low K material, the layer of copper, and a portion of the silicon substrate with a laser scribing process to expose regions of the silicon substrate between the integrated circuits, wherein the exposing the mask layer to the plasma treatment process is performed prior to patterning the mask layer with the laser scribing process; and
subsequent to exposing the mask layer to the plasma treatment process, plasma etching the silicon substrate through the exposed regions of the silicon substrate to singulate the integrated circuits.

8. The method of claim 7, wherein the laser scribing process is a femtosecond-based laser scribing process, and wherein patterning the layer of silicon dioxide, the layer of low K material, and the layer of copper with the femtosecond-based laser scribing process comprises ablating the layer of silicon dioxide prior to ablating the layer of low K material and the layer of copper.

9. The method of claim 7, wherein forming the mask layer comprises spin-coating a layer of photoresist or a water soluble mask layer on the integrated circuits, and wherein exposing the mask layer to the plasma treatment process comprises removing residual deposition solvent remaining from forming the mask layer.

10. The method of claim 7, wherein forming the mask layer comprises plasma-depositing a Teflon mask layer on the integrated circuits, and wherein exposing the mask layer to the plasma treatment process comprises condensing the Teflon mask layer.

11. The method of claim 7, wherein exposing the mask layer to the plasma treatment process comprises using a plasma based on argon (Ar) gas, nitrogen ($N_2$) gas, or a combination of Ar and $N_2$ gas.

12. The method of claim 7, wherein patterning the mask layer with the laser scribing process comprises forming trenches in the regions of the silicon substrate between the integrated circuits, and wherein plasma etching the silicon substrate comprises extending the trenches to form corresponding trench extensions.

13. The method of claim 12, wherein each of the trenches has a width, and wherein each of the corresponding trench extensions has the width.

14. A method of dicing a semiconductor wafer comprising a plurality of integrated circuits, the method comprising:
forming a mask above the semiconductor wafer, the mask comprising a layer covering and protecting the integrated circuits;
exposing the mask to a plasma treatment process to increase an etch resistance of the mask;
patterning the mask with a laser scribing process to provide gaps in the mask, the gaps exposing regions of the semiconductor wafer between the integrated circuits, wherein the exposing the mask to the plasma treatment process is performed subsequent to patterning the mask with the laser scribing process; and
subsequent to exposing the mask to the plasma treatment process, plasma etching the semiconductor wafer through the gaps in the mask to singulate the integrated circuits.

15. The method of claim 14, wherein forming the mask comprises spin-coating a layer of photoresist or a water soluble mask layer on the integrated circuits, and wherein exposing the mask to the plasma treatment process comprises removing residual deposition solvent remaining from forming the mask.

16. The method of claim 14, wherein forming the mask comprises plasma-depositing a Teflon mask layer on the integrated circuits, and wherein exposing the mask to the plasma treatment process comprises condensing the Teflon mask layer.

17. The method of claim 14, wherein exposing the mask to the plasma treatment process comprises using a plasma based on argon (Ar) gas, nitrogen ($N_2$) gas, or a combination of Ar and $N_2$ gas.

18. The method of claim 14, wherein patterning the mask with the laser scribing process comprises forming trenches in the regions of the semiconductor wafer between the integrated circuits, and wherein plasma etching the semiconductor wafer comprises extending the trenches to form corresponding trench extensions.

19. The method of claim 18, wherein each of the trenches has a width, and wherein each of the corresponding trench extensions has the width.

20. A method of dicing a semiconductor wafer comprising a plurality of integrated circuits, the method comprising:
forming a mask layer above a silicon substrate, the mask layer covering and protecting integrated circuits disposed on the silicon substrate, the integrated circuits comprising a layer of silicon dioxide disposed above a layer of low K material and a layer of copper;
exposing the mask layer to a plasma treatment process to increase an etch resistance of the mask layer;
patterning the mask layer, the layer of silicon dioxide, the layer of low K material, the layer of copper, and a portion of the silicon substrate with a laser scribing process to expose regions of the silicon substrate between the integrated circuits, wherein the exposing the mask layer to the plasma treatment process is performed subsequent to patterning the mask layer with the laser scribing process; and
subsequent to exposing the mask layer to the plasma treatment process, plasma etching the silicon substrate through the exposed regions of the silicon substrate to singulate the integrated circuits.

21. The method of claim 20, wherein the laser scribing process is a femtosecond-based laser scribing process, and wherein patterning the layer of silicon dioxide, the layer of low K material, and the layer of copper with the femtosecond-based laser scribing process comprises ablating the layer of silicon dioxide prior to ablating the layer of low K material and the layer of copper.

22. The method of claim 20, wherein forming the mask layer comprises spin-coating a layer of photoresist or a water soluble mask layer on the integrated circuits, and wherein exposing the mask layer to the plasma treatment process comprises removing residual deposition solvent remaining from forming the mask layer.

23. The method of claim 20, wherein forming the mask layer comprises plasma-depositing a Teflon mask layer on the integrated circuits, and wherein exposing the mask layer to the plasma treatment process comprises condensing the Teflon mask layer.

24. The method of claim 20, wherein exposing the mask layer to the plasma treatment process comprises using a plasma based on argon (Ar) gas, nitrogen ($N_2$) gas, or a combination of Ar and $N_2$ gas.

25. The method of claim 20, wherein patterning the mask layer with the laser scribing process comprises forming trenches in the regions of the silicon substrate between the integrated circuits, and wherein plasma etching the silicon substrate comprises extending the trenches to form corresponding trench extensions.

26. The method of claim 25, wherein each of the trenches has a width, and wherein each of the corresponding trench extensions has the width.

* * * * *